(12) United States Patent
Fujii

(10) Patent No.: US 8,688,276 B2
(45) Date of Patent: Apr. 1, 2014

(54) TEACHING METHOD FOR TRANSFER ROBOT

(75) Inventor: Yoshinori Fujii, Susono (JP)

(73) Assignee: Ulvac, Inc., Kanagawa (JP)

( * ) Notice: Subject to any disclaimer, the term of this patent is extended or adjusted under 35 U.S.C. 154(b) by 469 days.

(21) Appl. No.: 13/054,824

(22) PCT Filed: Jul. 29, 2009

(86) PCT No.: PCT/JP2009/063468
§ 371 (c)(1),
(2), (4) Date: Feb. 8, 2011

(87) PCT Pub. No.: WO2010/013732
PCT Pub. Date: Feb. 4, 2010

(65) Prior Publication Data
US 2011/0125325 A1   May 26, 2011

(30) Foreign Application Priority Data

Aug. 1, 2008 (JP) ................................. 2008-200101

(51) Int. Cl.
*G05B 15/00*   (2006.01)

(52) U.S. Cl.
USPC ............ 700/264; 700/245; 700/258; 700/252

(58) Field of Classification Search
USPC ......... 700/186, 245, 246, 247, 248, 249, 250, 700/253, 254, 256, 259, 264, 61, 65, 69, 89, 700/88, 23; 901/1, 15, 2, 3, 4, 42, 43, 47, 6, 901/7, 9; 318/568.1, 568.12, 568.13, 318/568.15, 568.16, 568.19, 568.2, 568.21; 219/124.34, 125.1
See application file for complete search history.

(56) References Cited

U.S. PATENT DOCUMENTS 5,535,306 A * 7/1996 Stevens .......................... 700/254
5,655,060 A * 8/1997 Lucas ............................ 700/250
(Continued)

FOREIGN PATENT DOCUMENTS

JP       06-326172 A    11/1994
JP       09-252039 A     9/1997
(Continued)

OTHER PUBLICATIONS

Search Report and Written Opinion from Singapore Patent App. No. 201100400-9 (Jan. 31, 2012).
(Continued)

*Primary Examiner* — Ian Jen
(74) *Attorney, Agent, or Firm* — Cermak Nakajima LLP; Tomoko Nakajima

(57) ABSTRACT

There is provided a teaching method for a transfer robot which is capable of quickly performing teaching at high reliability. Relative to a transfer robot which, in a state in which a substrate to be processed in a plurality of processing chambers is supported, transfers the substrate to a predetermined position by turning and telescopic action on the same plane, teaching is made of the transfer actions. At this time, by using at least one detection means that is disposed so as to detect the substrate when the substrate is transferred among the processing chambers, the transfer robot is caused to perform transfer action. At least one index part provided in advance on an operating part of the transfer robot is detected by the detection means. From this detection position, a reference position which serves as an origin of at least one of the turning action and the telescopic action is taught.

10 Claims, 4 Drawing Sheets

(56) References Cited

U.S. PATENT DOCUMENTS

| | | | |
|---|---|---|---|
| 5,783,834 A * | 7/1998 | Shatas | 250/559.33 |
| 6,257,045 B1 * | 7/2001 | Hosokawa et al. | 73/1.79 |
| 6,502,054 B1 * | 12/2002 | Mooring et al. | 702/150 |
| 6,633,046 B1 * | 10/2003 | Mitchell et al. | 250/492.21 |
| 6,856,863 B1 * | 2/2005 | Sundar | 700/254 |
| 6,934,606 B1 * | 8/2005 | Genetti et al. | 700/254 |
| 7,003,375 B2 * | 2/2006 | Inui | 700/218 |
| 7,397,539 B2 * | 7/2008 | Willems Van Dijk et al. | 355/72 |
| 7,551,979 B2 * | 6/2009 | Saraliev | 700/245 |
| 8,041,450 B2 * | 10/2011 | Takizawa et al. | 700/214 |
| 8,078,304 B2 * | 12/2011 | Rice et al. | 700/112 |
| 2002/0157691 A1 * | 10/2002 | Wada | 134/61 |
| 2003/0164181 A1 * | 9/2003 | Ohtani | 134/62 |
| 2003/0198376 A1 * | 10/2003 | Sadighi et al. | 382/153 |
| 2003/0223057 A1 * | 12/2003 | Ramsey et al. | 356/147 |
| 2005/0030524 A1 * | 2/2005 | Perry et al. | 356/139.03 |
| 2005/0102064 A1 * | 5/2005 | Donoso et al. | 700/254 |
| 2006/0021639 A1 * | 2/2006 | Masuda et al. | 134/61 |
| 2006/0222477 A1 * | 10/2006 | Moura et al. | 414/217 |
| 2007/0131246 A1 * | 6/2007 | Izumi | 134/1.3 |
| 2008/0121804 A1 * | 5/2008 | Nakasuji et al. | 250/310 |
| 2008/0175693 A1 * | 7/2008 | Fujii | 414/217 |

FOREIGN PATENT DOCUMENTS

| | | |
|---|---|---|
| JP | 11-254359 A | 9/1999 |
| JP | 2001-068530 A | 3/2001 |
| JP | 2007-027378 A | 2/2007 |

OTHER PUBLICATIONS

International Search Report for PCT Patent App. No. PCT/JP2009/063468 (Oct. 27, 2009).

* cited by examiner (a)

(b)

(a)

(b)

TEACHING METHOD FOR TRANSFER ROBOT

This application is a national phase entry under 35 U.S.C. §371 of PCT Patent Application No. PCT/JP2009/063468, filed on Jul. 29, 2009, which claims priority under 35 U.S.C. §119 to Japanese Patent Application No. 2008-200101, filed Aug. 1, 2008, both of which are incorporated by reference.

TECHNICAL FIELD

The present invention relates to an inexpensive teaching method for a transfer robot, the method utilizing such a sensor for detecting the position of a substrate as is disposed in an existing processing apparatus.

BACKGROUND ART

As an apparatus for performing various processing operations such as film-forming processing, etching processing, and the like on a substrate, there is known the following processing apparatus (so-called cluster tool apparatus). In other words, as shown in FIG. 1, a load lock chamber B and a plurality of processing chambers C are disposed in a manner to enclose a central transfer chamber A in which is disposed a transfer robot 1. The substrate S that has been charged into the load lock chamber B is transferred to each of the processing chambers C or among the respective processing chambers C by the transfer robot 1.

The transfer robot 1 is provided with a robot arm 11, and a drive means for driving the robot arm 11 in a manner to be capable of turning and telescopically moving (i.e., extended and contracted) on the same plane. At a front end of the robot arm 11, there is connected a robot hand 12 which is adapted to support the substrate S through a gear box G in a state in which the substrate S is mounted in position thereon. The robot arm 11 and the robot hand 12 constitute an operating part of the transfer robot.

In the above-mentioned transfer robot 1, it is necessary: to appropriately hold by the robot hand 12 the substrate S that is present in a predetermined position; to transfer the substrate S to a target position (e.g., to a substrate stage Cs in each of the processing chambers C); and to hand over the substrate S to an appropriate position. For that purpose, there is provided a detection means 2 such as an optical sensor and the like on the ceiling portion and the bottom portion at a border region between the transfer chamber A and each of the processing chambers C1 through C3 (see FIG. 1(b)).

In case the substrate S is transferred by the transfer robot from a predetermined position to the target position, an arrangement is made: to confirm whether or not the substrate S is supported by the robot hand 12 at a high accuracy; to perform the operation of the robot arm 11 to the next position; to open or close the gate valve that partitions each of the processing chambers; and to perform the like operations. On the other hand, when a positional deviation of the substrate S has been found, the operation of the robot arm 11 is adjusted to compensate for the amount of the positional deviation (see, e.g., patent document 1).

In the above-mentioned transfer robot, all the transfer actions have been decided in advance by programs, and teaching is performed to teach the programs the origin and the order (transfer action) of the transfer actions of the transfer robot. It is so arranged that the taught transfer actions are reproduced so that the transfer robot can be operated. Therefore, at the time of disposing the transfer robot to the processing apparatus or of replacing the robot arm or robot hand for maintenance purpose, teaching used to be performed manually at the position of handing over the substrate and the like.

As the teaching method for the transfer robot, there are generally known the following methods, i.e., a method (so-called direct teaching) in which the robot arm or the robot hand is directly held to teach the position of transferring the substrate and the like, and a method (so-called remote teaching) in which the robot is manipulated by a teaching box so that the position to serve as an origin of transfer action is sequentially designated by operating the robot.

However, in the conventional teaching, the operator used to perform the teaching operation while visually confirming the movement of the transfer robot. Therefore, there is a problem in that fluctuations in accuracy are likely to occur from operator to operator and consequently that the teaching of transfer actions lacks in reliability.

PRIOR ART DOCUMENT

Patent Document

Patent Document 1: JP-A-2007-27378

SUMMARY OF THE INVENTION

Problems to be Solved by the Invention

In view of the above-mentioned points, this invention has a problem of providing an inexpensive teaching method for a transfer robot, in which method the teaching can be made quickly at a high reliability.

Means for Solving the Problems

In order to solve the above-mentioned problems, according to this invention, there is provided a teaching method for a transfer robot, in which teaching to the transfer robot is made of transfer actions of the transfer robot adapted to perform turning and telescopic actions on the same plane in a state of supporting a to-be-processed substrate which is processed among a plurality of processing chambers. The method comprises: detecting at least one index part provided in advance on an operating part of the transfer robot, the detection being made, while subjecting the transfer robot to transfer actions, by using at least one detection means disposed so as to detect the substrate at a time of transferring the substrate among the processing chambers; and teaching, from this detection position of the index part, a reference position which serves as an origin of at least one of the turning action and the telescopic action.

According to this invention, the following arrangement has been made. In a processing apparatus in which a plurality of processing chambers are disposed around the transfer chamber in order to perform therein various processing operations, at the time of transferring the substrate by the transfer robot in the transfer chamber, the operating part of the transfer robot is detected when it crosses the detection means disposed to detect the substrate position. In view of the above point, this detection means is utilized in teaching the transfer action of the transfer robot to the transfer robot. In other words, for example, based on the design dimensions or on the action region of the operating part of the transfer robot, an index part is provided in advance, out of the entire operating parts, at a position which can serve as an origin at the time of telescopic action of, or turning action of, the transfer robot, the position being also capable of detection by the detection means. Then, at the time of teaching the transfer action, the operating part is turned or telescopically moved either manually or automatically to thereby cause the index part to be detected by the detection means. From this detection position, teaching is now made of the reference position which serves as the origin of at least one of the turning and telescopic actions.

As described, according to this invention, by making use of the existing detection means that is disposed in the processing apparatus, teaching is made of the transfer action of the transfer robot while detecting the operating part. Therefore, fluctuations in accuracy from one operator to another operator hardly occur, whereby the work of teaching can be performed simply and quickly. In addition, without bringing about an increase in the number of constituent parts, the reduction in cost can be attained. Further, since the teaching of transfer action is performed by using the detection means, teaching can still be performed under the vacuum atmosphere of the vacuum chamber. Still furthermore, in case initializing operation is performed at the time of starting up the transfer robot, the soundness of the transfer robot can also be judged if judgment is made as to whether the index parts of the transfer robot are sequentially detected by the detection means.

In this invention, in case the detection means is an optical sensor disposed so as to project light in a direction perpendicular to the plane, the index part is preferably constituted by at least one through hole formed in the operating part. The index part can thus be materialized in a simple arrangement.

In this case, if the transfer robot is arranged to be moved for scanning around the through hole, the center of the through hole can be more accurately identified and thus teaching of higher accuracy becomes possible.

If, e.g., a robot hand is replaced at the time of maintenance, there is a case in which the robot hand is assembled in a state of being inclined in the turning direction relative to the gear box. In such a state, even if teaching is made of the reference position of the transfer robot in the above-mentioned method, there is a possibility that the robot hand will give rise to a positional deviation at a target position. As a solution, preferably, prior to the teaching of the origin, at least two index parts are detected by the detection means, and a deviation in the direction of the telescopic action or the turning action is corrected, at the time of having assembled the operating part of the transfer robot, based on a predetermined comparison value. The comparison value can be prepared through computation of the design dimensions of the transfer robot or the data at the time of previous teaching.

In this invention, there may be employed an arrangement in which the substrate is supported by the transfer robot and in which, in place of the operating part or in addition to the operating part, the index part is formed in the substrate.

EMBODIMENTS FOR CARRYING OUT THE INVENTION

Figure 1:
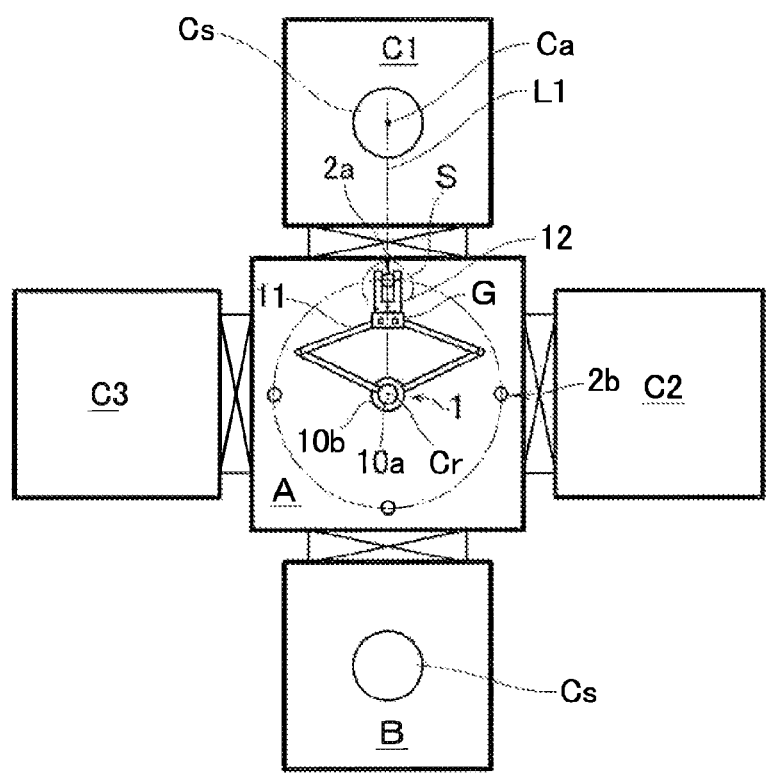
FIGS. 1(*a*) and (*b*) are plan view and sectional view showing a processing apparatus provided with a transfer robot.
Figure 1:
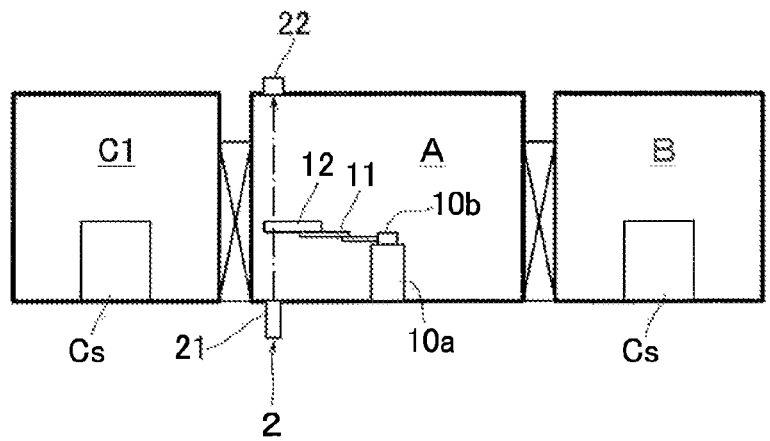

Description will now be made of an embodiment in which this invention is applied to a processing apparatus as shown in FIG. 1. In other words, the transfer chamber A is provided with the transfer robot 1 having a known construction, and is further provided with detection means 2 in the neighborhood of the portions of connection to a load lock chamber B and to each of the processing chambers C1 through C3.

As the detection means 2, there are used an optical sensor such, e.g., as a laser sensor, an LED fiber sensor and the like, and a visual sensor such as a CCD camera, all having a known construction. A description will be made of the following example. In this embodiment, the detection sensor 2 is disposed: such that light is projected vertically toward the transfer robot 1 which is driven so as to be capable of turning and telescopically moveable on the same plane (horizontal plane); and also such that the detection sensor 2 is positioned on the line L1 that connects the center of rotation of a motor (to be described hereinafter) of the transfer robot 1 and the center Ca of the substrate stage Cs in the load lock chamber B and in each of the processing chambers C1 through C3. The detection sensor 2 uses a translucent type of detection sensor 2 made up of a projector 21 and a photo-detector 22. As the optical sensor, there may be used a reflection type.

Figure 2:
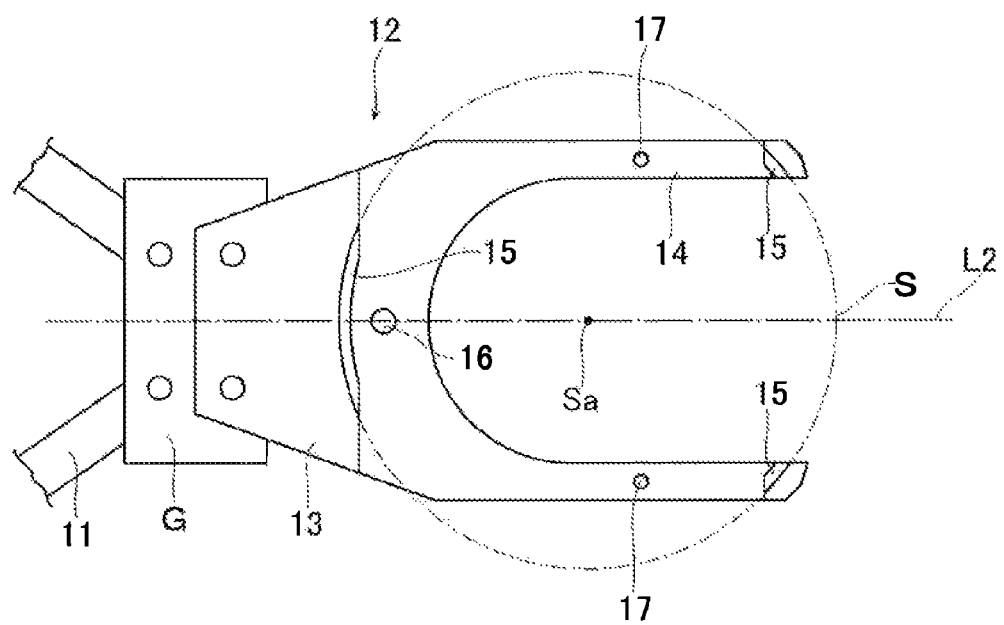
FIG. 2 is a plan view showing a robot hand according to an embodiment of this invention.

With reference to FIG. 2, the transfer robot 1 has two motors as driving means (not illustrated), and control means (not illustrated) which controls the operation of the motors. A rotary shaft 10*a*, 10*b* of each of the motors is disposed concentrically with each other, and each of the rotary shafts 10*a*, 10*b* has connected thereto a robot arm 11 so as to form a link mechanism. At a front end of the robot arm, there is mounted a robot hand 12 through a gear box G. According to this arrangement, by appropriately controlling the angle of rotation and the direction of rotation of the rotary shaft 10*a*, 10*b* of each of the motors, the robot arm 11 becomes telescopically moveable and/or capable of turning. The robot arm 11 and the robot hand 12 constitute the operating parts of this invention.

The robot arm 11 and the robot hand 12 are formed of a material having heat resistivity such as a plate material of $Al_2O_3$, $SiO_2$, SiC and the like since there are cases where the substrate S is heated to a high temperature in the processing chamber C. The robot hand 12 has a pair of finger portions 14 which are bifurcated and elongated forward from a base end portion 13 that is connected to the robot arm 11. At the base end portion 13 and at front end portions of both the finger portions 14, there are provided seating surfaces 15 on which the peripherally outer portion of the bottom surface of the substrate S can be seated after alignment at three positions. The substrate S can thus be supported in such a manner that the bottom surface other than the peripherally outer portion of the substrate S is kept lifted off out of contact with the robot hand 12.

After having supported the substrate S by the robot hand 12, the robot arm 11 is telescopically moved or turned so that the substrate S charged into the load lock chamber B is transferred to any one of the processing chambers C1 through C3 or among each of the processing chambers C1 through C3. At the time of transferring the substrate S from a predetermined position to a target position, confirmation is made by any one of the detection means 2 to see whether or not the substrate S is being held at a high accuracy by the robot hand 12.

A description will now be made of an example in which the substrate S is transferred by the transfer robot 1 from the first processing chamber C1 to the second processing chamber C2. From a standby position (a predetermined position capable of turning) in which the robot arm 11 is contracted and in which the front ends of the finger portions 14 are directed toward the first processing chamber C1, the robot arm 11 is extended to the substrate stage Cs (target position) inside the first processing chamber C1 to thereby receive the substrate S. The robot arm 11 is then contracted and is returned to the standby position. Then, the robot arm 11 is turned to the position in which the front ends of the finger portions 14 are directed toward the second processing chamber C2. Then, the robot arm 11 is extended once again to hand over the substrate S (to become the next target position) to the substrate stage Cs in the second processing chamber C2, and returns to the standby position.

In order to teach the above-mentioned transfer actions, teaching of the transfer robot 1 is performed when the transfer robot 1 is assembled to the processing apparatus, or when the robot arm 11 or the robot hand 12 is removed or replaced for the purpose of maintenance. Then, the transfer actions are stored in the control means (not illustrated) which control the operations of the transfer robot 1. It may be so arranged that the control means also performs an overall (or central) control of the operations of the detection means 2 and the operations of the constituent parts such as gate valves and the like that are disposed in the processing apparatus.

In case the substrate S is sequentially transferred among each of the processing chambers C1 through C3 by using the processing apparatus to perform predetermined processing operations, the above-mentioned transfer actions are reproduced in accordance with the transfer actions as stored in memory, and the transfer robot 1 is operated. At this time, the robot arm 11 and the robot hand 12 will give rise to portions which respectively cross the detection positions 2a, 2b (crossing portions) of each of the detection means 2.

Therefore, in this embodiment, the robot hand 12 has formed therein in advance at least one index part in a manner to correspond to the crossing portions. While detecting this index part by the detection means 2, the teaching of the transfer robot 1 is arranged to be performed without relying on the visual confirmation by an operator. A description will hereinafter be made of a concrete teaching method of the transfer robot 1 according to this embodiment.

The index part may be formed, e.g., in the following way. In a predetermined position of the base end portion 13 of the robot hand 12, there is formed a through hole 16 which is circular in plan view and which has a diameter larger than the diameter of the laser beam of the detection means 2, so that the through hole 16 is located on the center line L2 that passes through the center Sa of the substrate S and the center of rotation Cr of the rotary shafts 10a, 10b of the motors when the substrate S is appropriately supported by the robot hand 12 (see FIG. 2).

The through hole 16 may be fabricated at the time of manufacturing the robot hand 12 based on detailed specification about the position of the detection means 2 in the processing apparatus, design dimensions of the transfer robot 1, and the region of movements of the operating parts. Regarding the diameter and the shape of the through hole 16, without being limited to the above example, anything will do as long as such quantity of light can be obtained as will be sufficient for the photo detector 22 to stably receive light from the light projector 21. Further, in case a reflection type of detection means is employed, a member to reflect the light may be disposed in a predetermined position within a range equivalent to the area of the above-mentioned through hole. In addition, in case of a visual sensor, a mark may be attached to the visual sensor.

A description will now be made of an example in which a transfer robot having a robot hand 12 provided with the above-mentioned index part is used to perform the teaching of transfer actions of the substrate S from the first processing chamber C1 to the second processing chamber C2. First, the origin of the telescopic action is specified relative to the processing chamber C1. In this case, from the standby position (see FIG. 1(a)) of the transfer robot 1 in which the front end of the finger portion 14 is directed toward the first processing chamber C1, the robot arm 11 is extended by rotating the rotary shafts 10a, 10b so as to search for the position in which the through hole 16 is detected by the detection means 2.

At the beginning of extending the robot arm 11, since the light from the projector 21 will not be shielded by the robot hand 12, the signal of the detection means 2 is in a state of being switched ON. When the robot arm 11 is further extended so that the light from the projector 21 is shielded by the base end portion 13 of the robot hand 12, the signal of the detection means 2 will be in a state of being switched OFF. In this state the rotary shafts 10a, 10b are rotated to perform turning and/or extending and contracting of the robot hand 12, thereby finding out the position in which the signal of the detection means 2 becomes the state of being switched ON (see FIG. 3(a)).

Figure 3:
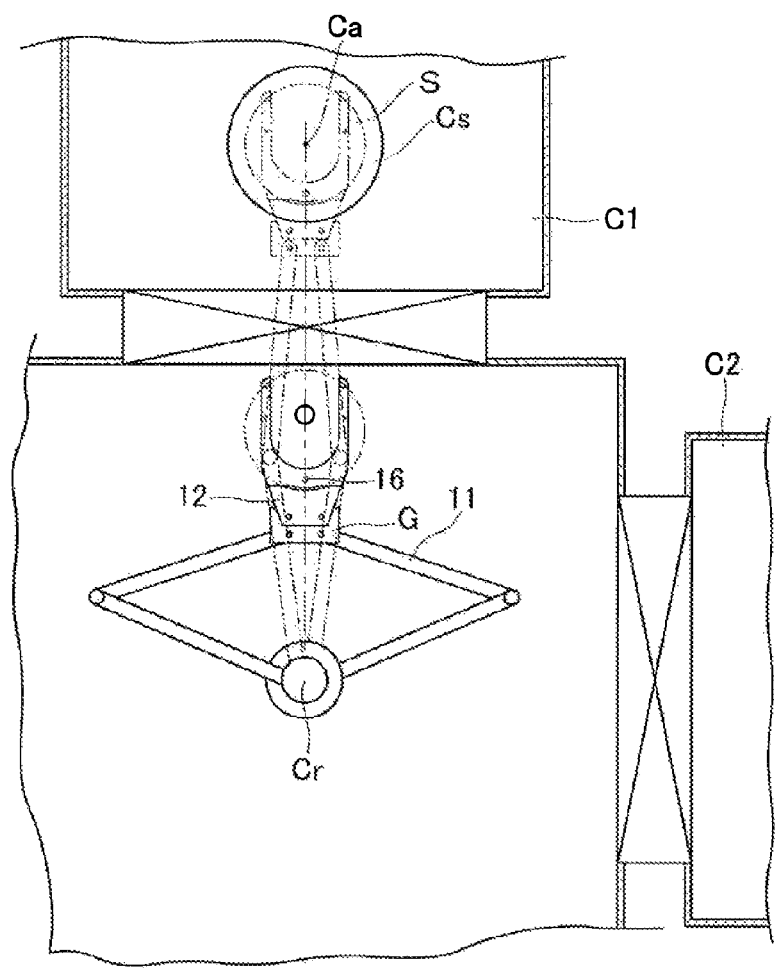
FIG. 3(*a*) is a schematic plan view to explain the teaching of a transfer robot and FIG. 3(*b*) is a plan view to explain the detection of through holes as index parts.
Figure 3:
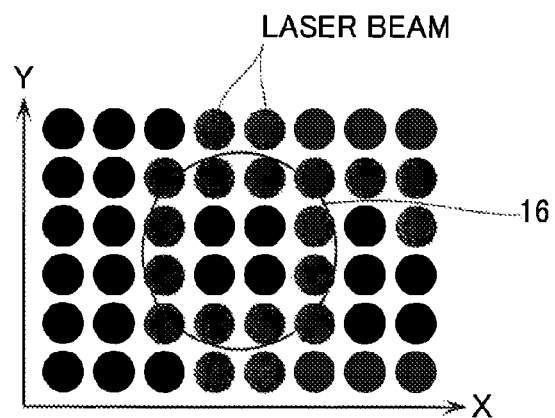

When the through hole 16 has been detected as a result of the signal of the detection means 2 having been switched ON, the robot arm 11 is moved for scanning in the X-axis direction and in the Y-axis direction, respectively (see FIG. 3(b)). At this time, the signal of the detection means 2 is switched ON or OFF and, from the period of switching thereof, the center coordinates of the through hole 16 are identified (see FIG. 4). In case the center coordinates of the through hole 16 have been identified by the detection means 2, the center line L2 can be seen to be positioned on the line L1 (see FIG. 1) that connects the center of rotation Cr of the rotary shafts 10a, 10b of the motors and the center Ca of the substrate stages Cs in the load lock chamber B and each of the processing chambers C1 through C3. The robot hand 12 can thus be aligned accurately relative to the processing chamber C1. From this state, the robot arm 11 is contracted along the same line to return it to the standby position. This position is taught to the control means as a first reference position that serves to be an origin for turning or telescopic action. The turning or telescopic action of the robot arm 11 and the robot hand 12 may alternatively be performed manually.

From the distance between the center of rotation Cr of the motors 10a, 10b and the center Ca of the substrate stage Cs in the processing chamber C1, computation is made of the length of extension of the robot arm 11, and teaching is made of the position for receiving and handing over the substrate S on the substrate stage Cs. According to the above-mentioned arrangement, teaching to the transfer robot 1 relating to the processing chamber C1 is finished. Accordingly, it becomes possible to receive and hand over the substrate S to and from the substrate stage Cs in a state in which the center Sa of the substrate S is coincident with the center Ca of the substrate stage Cs.

Figure 4:
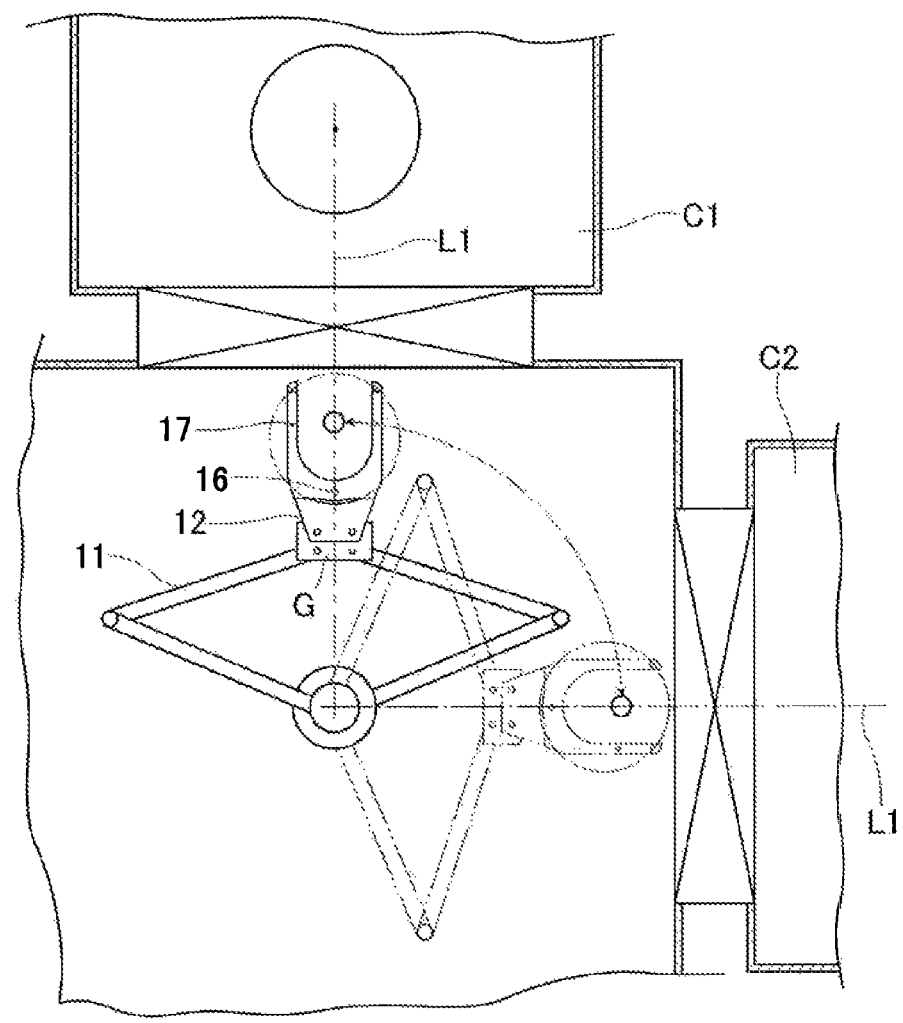
FIG. 4 is another schematic plan view to explain the teaching of a transfer robot.

After having returned the robot arm 11 to the standby position, the robot arm 11 is turned from the position in which the front end of the finger portion 14 is directed to the processing chamber C1 to the position in which the front end of the finger portion 14 is directed to the second processing chamber C2 (see FIG. 4). Then, in the procedures similar to those as described above, the second position which serves as the origin of operation of the transfer robot 1 is specified. By repeating the above-mentioned procedures, teaching is made of the reference positions which serve as the origins for turning or telescopic actions relative to the load lock chamber B and all of the processing chambers C1 through C3.

According to the above-mentioned embodiment, by making use of the existing detection means 2 disposed in the processing apparatus, teaching is made of the transfer actions of the transfer robot 1. Therefore, fluctuations in accuracy hardly take place from operator to operator, and it becomes possible to simply and quickly perform the teaching operation. In addition, without incurring an increase in the number of constituent parts, an attempt can be made to reduce the cost.

In addition, since the teaching of the transfer actions is performed by using the detection means 2, there are cases in which teaching is possible in each of the processing chambers C1 through C3 that are under vacuum atmosphere. Furthermore, if judgment is made as to whether the index part 16 is detected by the detection means 2 when initializing action is performed at the starting up of the transfer robot 1, the soundness of the transfer robot 1 can also be judged.

In the above-mentioned processing apparatus, an arrangement has been made that load lock chamber B and the transfer chambers C1 through C3 are disposed while deviating by 90 degrees around the transfer chamber A. Therefore, it is also possible to perform the teaching of the transfer robot 1 relative to the other load lock chamber B and the transfer chambers C1 through C3 based on the design values thereof by using the coordinates at the position which serves as the origin of the transfer robot 1 that has received teaching in any one of the load lock chamber B and the transfer chambers C1 through C3, as described above. According to this arrangement, the center of the through hole 16 can be searched quickly to the advantage of simplification of the teaching work. Further, when teaching is performed by assembling the transfer robot 1 to another apparatus having similar construction, the teaching of the transfer robot 1 may alternatively be performed by using the above-mentioned coordinates.

In the above-mentioned embodiment, a description was made of an example in which a detection means is attached to an ordinary processing apparatus. However, without being limited thereto, the teaching method of this invention can be applied if the position of the index part is appropriately changed depending on the position of mounting the detection means. Further, in performing the teaching of the transfer actions, it may be so arranged that the substrate S is supported by the transfer robot 1 and that, in place of the robot arm 11 and the robot hand 12, or in addition thereto, through holes may be formed in the substrate S or notches may be formed on the peripheral portion of the substrate to thereby make them serve as index parts.

In this embodiment, a description was made of an example in which one through hole 16 was formed in the base end portion 13 and in which this through hole 16 was detected to perform teaching of the transfer actions. It is to be noted that the index part may be formed in a plurality of pieces. In other words, in case the robot arm 11 is turned from the standby position thereof, a part of the finger portion 14 comes to cross the detection means 2 (see FIG. 4). In such a case, based on the design values and the like of the processing apparatus, that part of the finger portion 14 which crosses the detection means 2 has formed therein a circular, as seen in plan view, through hole (another index part) 17 which is larger in diameter than the laser beam diameter of the detection means 2. Then, after having performed teaching of the reference position as described above, judgment is made as to whether said another index part 17 is detected or not when the robot arm 11 is rotated.

When the robot hand 12 has been removed for maintenance or has been replaced, the robot hand 12 will sometimes be deviated so as to be inclined from the center line L1. However, according to the above-mentioned arrangement, if teaching is performed by specifying the two positions of the index parts 16, 17, the inclination can be corrected and the transfer actions can be taught, whereby a high-accuracy teaching becomes possible. On the other hand, when the inclination of the robot hand 12 is corrected, the coordinate value at which the through hole 17 as said another index part is detected, is stored in the control means in advance as a comparative value. After completion of the maintenance and prior to the teaching, the coordinate data at which both the through holes 17 are detected by the detection means 2 is obtained. It is thus possible to correct the inclination of the robot hand 12 by comparing this coordinate value and the comparison value.

Further, in case the robot hand 12 is provided with a pair of finger portions 14 that are bifurcated into a fork from the base end portion 13 so as to be elongated forward, the robot arm 11 may be turned, and both the finger portions are respectively detected by the detection means 2, to thereby specify the center line L2. In other words, when the robot arm 11 is turned, the finger portion 14 that lies on the front side of the turning direction crosses the detection means 2. At this time the signal of the detection means 2 will be switched from OFF to ON and will then be switched to OFF after a lapse of a predetermined time. When the finger portion 14 that lies on the rear side of the turning direction subsequently crosses the detection means 2, the signal of the detection means 2 will be switched again from OFF to ON and will then be switched to OFF after a lapse of a predetermined time. Based on the switching of these signals, the center line L2 of the robot hand 12 can be specified. According to the above arrangement, teaching can be made of transfer action by specifying the reference position. In this case, the finger portion 14 constitutes the index part.

In the above-mentioned embodiment a description has been made of an example in which the robot arm 11 is telescopically moveable and/or is capable of turning by appropriately controlling the rotation angle and rotation direction of those rotary shafts 10a, 10b of the motors which are disposed in a coaxial relationship with each other. This invention can however be applicable to other articulated robots. In such a case, if the robot hand can be moved horizontally in a direction perpendicular to the direction of telescopic movement of the robot hand, teaching may be made by forming two index parts at an equal distance from each other on both sides of the line orthogonal to the line that connects the center of rotation of the driving source to be disposed in the transfer chamber A and the center Ca of the substrate stage Cs in each of the processing chambers C1 through C3.

DESCRIPTION OF REFERENCE NUMERALS AND CHARACTERS

11 robot arm
12 robot hand
16, 17 through hole (index part)
2 detection means
2a, 2b detection position
S substrate
A load lock chamber
B transfer chamber
C processing chamber
Cs substrate stage

What is claimed is:

1. A teaching method for a transfer robot, in which teaching to the transfer robot is made of transfer actions of the transfer robot adapted to perform turning and telescopic actions on a same plane in a state of supporting a to-be-processed substrate which is processed among a plurality of processing chambers, the method comprising:

detecting at least one index part provided in advance on an operating part of the transfer robot at a detection position, the detection being made, while subjecting the transfer robot to transfer actions, by using at least one detector disposed so as to detect the substrate at a time of transferring the substrate among the processing chambers;

teaching, from this detection position of the index part, a reference position which serves as an origin of at least one of the turning action and the telescopic action; and detecting at least another index part, in addition to the at least one index part, by the detector prior to the teaching of the origin, and correcting a deviation in the direction of the telescopic action or the turning action.

2. The teaching method according to claim 1, wherein, in case the detection means is an optical sensor disposed so as to project light in a direction perpendicular to the plane, the index part is constituted by at least one through hole formed in the operating part.

3. The teaching method according to claim 2, wherein the transfer robot is arranged to be moved for scanning around the through hole.

4. The teaching method according to claim 1, further comprising:

prior to the teaching of the origin, detecting second another index park by the detector, and correcting a deviation in the direction of inclination in the correction step at the time of having assembled the operating part of the transfer robot, based on a predetermined comparison value.

5. The teaching method according to claim 1, wherein the substrate is supported by the transfer robot and wherein, in place of the operating part or in addition to the operating part, the index part is formed in the substrate.

6. The teaching method according to claim 2, wherein, prior to the teaching of the origin, at least two index parts are detected by the detection means, and a deviation in the direction of the telescopic action or the turning action is corrected, at the time of having assembled the operating part of the transfer robot, based on a predetermined comparison value.

7. The teaching method according to claim 3, wherein, prior to the teaching of the origin, at least two index parts are detected by the detection means, and a deviation in the direction of the telescopic action or the turning action is corrected, at the time of having assembled the operating part of the transfer robot, based on a predetermined comparison value.

8. The teaching method according to claim 2, wherein the substrate is supported by the transfer robot and wherein, in place of the operating part or in addition to the operating part, the index part is formed in the substrate.

9. The teaching method according to claim 3, wherein the substrate is supported by the transfer robot and wherein, in place of the operating part or in addition to the operating part, the index part is formed in the substrate.

10. The teaching method according to claim 4, wherein the substrate is supported by the transfer robot and wherein, in place of the operating part or in addition to the operating part, the index part is formed in the substrate.

* * * * *